(12) United States Patent
Han et al.

(10) Patent No.: US 11,963,322 B2
(45) Date of Patent: Apr. 16, 2024

(54) DISPLAY DEVICE AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventors: Wen Han, Hubei (CN); Hao Tang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/607,829

(22) PCT Filed: Sep. 9, 2021

(86) PCT No.: PCT/CN2021/117443
§ 371 (c)(1),
(2) Date: Oct. 29, 2021

(87) PCT Pub. No.: WO2023/024170
PCT Pub. Date: Mar. 2, 2023

(65) Prior Publication Data
US 2024/0023259 A1    Jan. 18, 2024

(30) Foreign Application Priority Data
Aug. 24, 2021 (CN) .......................... 202110973624.1

(51) Int. Cl.
*H05K 5/02* (2006.01)

(52) U.S. Cl.
CPC .................................. *H05K 5/0221* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 11,042,195 B1* | 6/2021 | Hong | H04M 1/0268 |
| 2019/0305237 A1* | 10/2019 | Shin | H04M 1/0268 |

FOREIGN PATENT DOCUMENTS

| | | |
|---|---|---|
| CN | 110035153 A | 7/2019 |
| CN | 110062068 A | 7/2019 |

(Continued)

OTHER PUBLICATIONS

Chinese Office Action issued in corresponding Chinese Patent Application No. 202110973624.1 dated Mar. 1, 2022, pp. 1-8.

(Continued)

*Primary Examiner* — Jerry Wu
(74) *Attorney, Agent, or Firm* — PV IP PC; Wei Te Chung; Zhigang Ma

(57) ABSTRACT

The present application provides a display device and a mobile terminal. It includes a frame, a flexible screen, a movable support mechanism, and a sensor. The flexible screen includes a fixed portion, a sliding portion, and a bent portion. The movable support mechanism includes a sliding assembly and a stretching assembly connected to each other. The sliding assembly contacts and is connected to the bent portion. The stretching assembly is fixedly connected to one end of the sliding portion away from the bent portion, so that the sliding assembly abuts against the bent portion. The sensor is arranged on one side of the sliding portion away from the fixed portion.

10 Claims, 6 Drawing Sheets

(56) References Cited

FOREIGN PATENT DOCUMENTS

| | | | |
|---|---|---|---|
| CN | 110300195 | A | 10/2019 |
| CN | 210093271 | U | 2/2020 |
| CN | 111277681 | A | 6/2020 |
| CN | 111385380 | A | 7/2020 |
| CN | 111524459 | A | 8/2020 |
| CN | 112532770 | A | 3/2021 |
| CN | 112735276 | A | 4/2021 |
| CN | 112866441 | A | 5/2021 |
| KR | 20170004327 | A | 1/2017 |

OTHER PUBLICATIONS

Written Opinion of the International Searching Authority in International application No. PCT/CN2021/117443, dated Mar. 28, 2022.
International Search Report in International application No. PCT/CN2021/117443, dated Mar. 28, 2022.

\* cited by examiner

DISPLAY DEVICE AND MOBILE TERMINAL

RELATED APPLICATIONS

This application is a Notional Phase of PCT Patent Application No. PCT/CN2021/117443 having international filing date of Sep. 9, 2021, which claims the benefit of priority of Chinese Patent Application No. 202110973624.1 filed on Aug. 24, 2021. The contents of the above applications are all incorporated by reference as if fully set forth herein in their entirety.

FIELD OF DISCLOSURE

The present application relates to a field of display technology and in particular, to a display device and a mobile terminal.

DESCRIPTION OF RELATED ART

Full-screen mobile phones have always been one of the mainstream technologies to realize high screen-ratio mobile phones. Currently, under-screen camera technology is often used to achieve full-screen display. However, conventional under-screen camera technology is difficult to satisfy light transmittance requirements for shooting. Even if pixels in a screen are reduced, it is difficult to provide sufficient light input required for camera imaging.

At present, the under-screen camera technology provides two solutions as follows. The first solution is a built-in under-screen camera, which installs a camera inside a mobile phone and uses gaps between pixels of an active matrix organic light-emitting diode (active AMOLED) screen to realize camera imaging. When taking a picture, light passes through a screen camera area, and then enters a sensor to realize a shooting function. When not taking pictures, a screen can display images normally. The second solution is an add-on type under-screen camera. A pop-up camera or a sliding-type camera is installed outside the mobile phone. When taking pictures, the camera pops up or slides out. When not taking pictures, the camera is retracted.

The first solution is difficult to meet the light transmittance requirements and has poor shooting quality. The second solution places the cameras externally, which results in higher mechanical failure rates, and has poor dust and water resistance and short service lives, and the cameras are exposed to be easily damaged.

SUMMARY

The present application provides a display device and a mobile terminal, wherein a sensor is placed under a flexible screen. When the sensor is not in use, full-screen display is enabled, and when the sensor is not in use, the sensor is directly exposed to increase light transmittance, and sensing capability of the sensor is improved.

The present application provides a display device, comprising:
  a frame;
  a flexible screen comprising a fixed portion and a sliding portion which are arranged opposite to each other, wherein a bent portion is connected between the fixed portion and the sliding portion, and the fixed portion is disposed on the frame;
  a movable support mechanism comprising a sliding assembly and a stretching assembly slidably connected to the frame, wherein the sliding assembly contacts and is connected to the bent portion, and the stretching assembly is connected to the sliding assembly and is fixedly connected to one end of the sliding assembly away from the bent portion, so that the sliding assembly abuts against the bent portion; and
  a sensor arranged on one side of the sliding portion away from the fixed portion;
  wherein the stretching assembly is configured to drive movement of the sliding portion and the bent portion during a sliding process relative to the frame, and to drive the sliding assembly to slide relative to the frame, so that the bent portion is in a first position to shield the sensor, or the bent portion is in a second position to expose the sensor.

In one embodiment of the present application, the movable support mechanism further comprises a transmission member connected between the sliding assembly and the stretching assembly, and when one of the sliding assembly and the stretching assembly moves, the transmission member is configured to drive the other one of the sliding assembly and the stretching assembly to move in a same direction.

In one embodiment of the present application, the transmission member comprises an elastic member, one end of the elastic member close to the bent portion is connected to the sliding assembly, and one end of the elastic member away from the bent portion is connected to the stretching assembly.

In one embodiment of the present application, whether the bent portion is in the first position or the second position, the elastic member is in a compressed state.

In one embodiment of the present application, a reel is disposed at one end of the sliding assembly connected to the bent portion, and the bent portion abuts on the reel.

In one embodiment of the present application, an opening is defined on one side of the frame close to the bent portion, the fixed portion is disposed on one side of the frame, and the bent portion is inserted through the opening, so that the sliding portion is disposed on one side of the frame away from the fixed portion.

In one embodiment of the present application, the frame comprises a first frame and a second frame detachably connected to one end of the first frame close to the bent portion, and the opening is defined in the second frame.

In one embodiment of the present application, the display device further comprises a driving member connected to the stretching assembly to drive the stretching assembly to move and to drive the bent portion to move between the first position and the second position.

In one embodiment of the present application, the display device further comprises a first lock member arranged on the movable support mechanism and a second lock member arranged on the frame; the first lock member and the second lock member are detachably connected to each other when the bent portion is in the first position; and the first lock member and the second lock member are separated from each other when the bent portion is in the second position.

Accordingly, the present application provides a mobile terminal, comprising a display device and a terminal body combined into one body, wherein the display device comprises:
  a frame;
  a flexible screen comprising a fixed portion and a sliding portion which are arranged opposite to each other, wherein a bent portion is connected between the fixed portion and the sliding portion, and the fixed portion is disposed on the frame;

a movable support mechanism comprising a sliding assembly and a stretching assembly slidably connected to the frame, wherein the sliding assembly contacts and is connected to the bent portion, and the stretching assembly is connected to the sliding assembly and is fixedly connected to one end of the sliding assembly away from the bent portion, so that the sliding assembly abuts against the bent portion; and a sensor arranged on one side of the sliding portion away from the fixed portion;

wherein the stretching assembly is configured to drive movement of the sliding portion and the bent portion during a sliding process relative to the frame, and to drive the sliding assembly to slide relative to the frame, so that the bent portion is in a first position to shield the sensor, or the bent portion is in a second position to expose the sensor.

In one embodiment of the present application, the movable support mechanism further comprises a transmission member connected between the sliding assembly and the stretching assembly, and when one of the sliding assembly and the stretching assembly moves, the transmission member is configured to drive the other one of the sliding assembly and the stretching assembly to move in a same direction.

In one embodiment of the present application, the transmission member comprises an elastic member, one end of the elastic member close to the bent portion is connected to the sliding assembly, and one end of the elastic member away from the bent portion is connected to the stretching assembly.

In one embodiment of the present application, whether the bent portion is in the first position or the second position, the elastic member is in a compressed state.

In one embodiment of the present application, a reel is disposed at one end of the sliding assembly connected to the bent portion, and the bent portion abuts on the reel.

In one embodiment of the present application, an opening is defined on one side of the frame close to the bent portion, the fixed portion is disposed on one side of the frame, and the bent portion is inserted through the opening, so that the sliding portion is disposed on one side of the frame away from the fixed portion.

In one embodiment of the present application, the frame comprises a first frame and a second frame detachably connected to one end of the first frame close to the bent portion, and the opening is defined in the second frame.

In one embodiment of the present application, the display device further comprises a driving member connected to the stretching assembly to drive the stretching assembly to move and to drive the bent portion to move between the first position and the second position.

In one embodiment of the present application, the display device further comprises a first lock member arranged on the movable support mechanism and a second lock member arranged on the frame; the first lock member and the second lock member are detachably connected to each other when the bent portion is in the first position; and the first lock member and the second lock member are separated from each other when the bent portion is in the second position.

ADVANTAGES OF THE PRESENT APPLICATION

Compared to conventional techniques, the present application arranges the sensor on one side of the flexible screen, and has the stretching assembly slidably connected to the frame and the sliding assembly connected to the stretching assembly. The sliding assembly abuts against the bent portion of the flexible screen, and the stretching assembly is connected to the sliding portion of the flexible screen, so that the stretching assembly can drive sliding movement of the sliding assembly to thereby move the bent portion and the sliding portion, so that the bent portion is in the first position to cover the sensor, or the bent portion is in the second position to expose the sensor. Accordingly, when the sensor is not in use, full-screen display is enabled to improve display performance of the display device. When the sensor is in use, the sensor can be directly exposed to increase light transmittance and improve sensing capability of the sensor.

BRIEF DESCRIPTION OF DRAWINGS

A description of the present application is provided in detail below in conjunction with the accompanying drawings and specific embodiments to make clear the technical solutions and advantages of the present application.

DETAILED DESCRIPTION OF EMBODIMENTS

Figure 1:
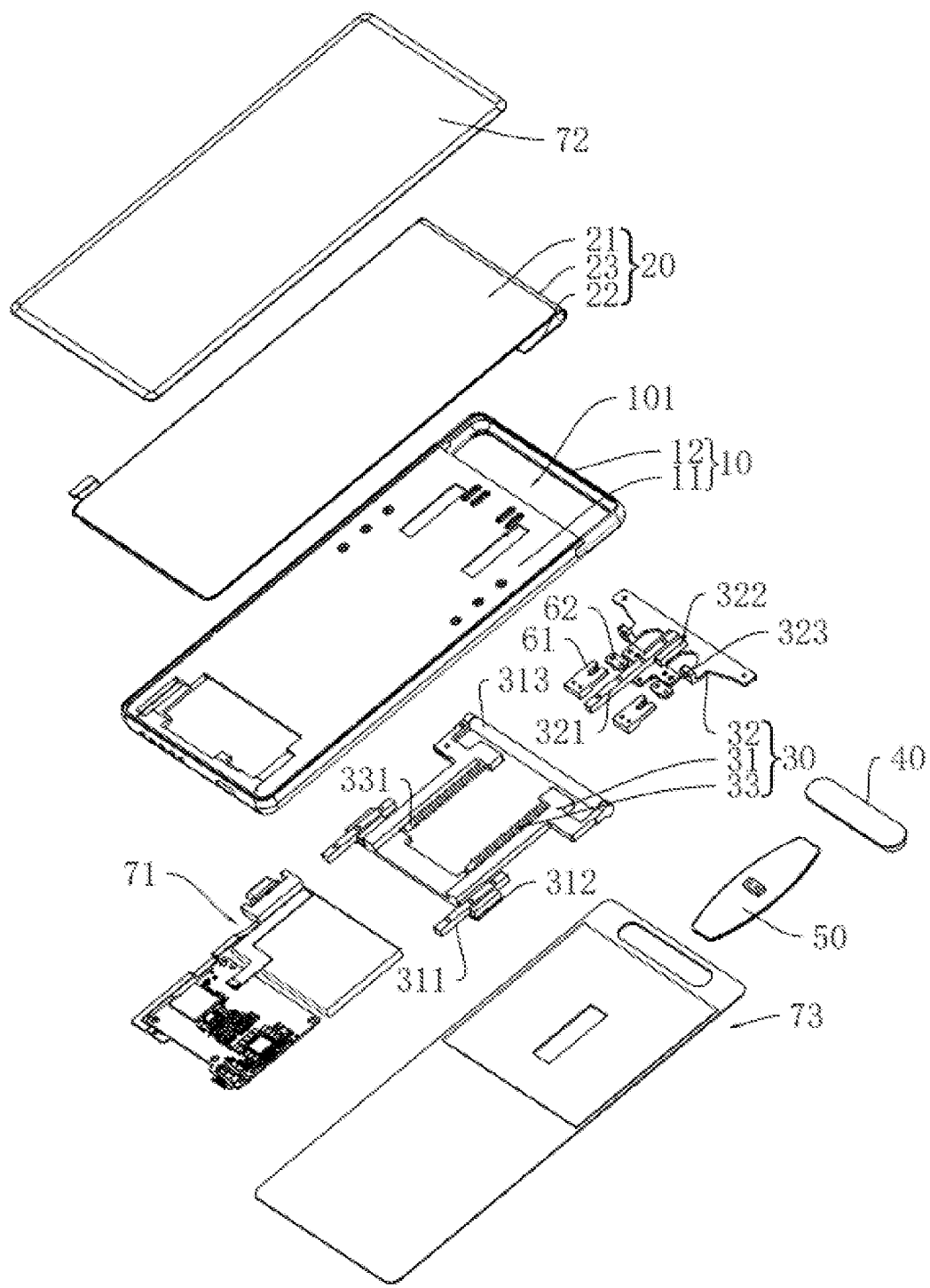
FIG. 1 is a schematic exploded view illustrating a display device according to one embodiment of the present application.

The technical solutions of the present application will be clearly and completely described below in conjunction with the accompanying drawings and with reference to specific embodiments of the present application. Obviously, the described embodiments are only some of the embodiments of the present application, rather than all the embodiments. Based on the embodiments in the present application, all other embodiments obtained by those skilled in the art without creative work shall fall within the protection scope of the present application.

The following disclosure provides many different embodiments or examples for realizing different structures of the present application. In order to simplify the disclosure of the present application, the following descriptions describe components and configurations of specific examples. Certainly, they are only examples, and are not intended to limit the present application. In addition, the present application may repeat reference numerals and/or reference letters in different examples, and such repetition is for the purpose of simplification and clarity, and does not indicate a relationship between various embodiments and/or configurations discussed. In addition, the present application provides examples of various specific processes and materials, but those of ordinary skill in the art may be aware of the use of other processes and/or other materials.

The present application provides a display device. Please refer to FIG. 1. The display device comprises a frame 10, a flexible screen 20, a movable support mechanism 30, and a sensor 40.

The flexible screen 20 comprises a fixed portion 21 and a sliding portion 22 disposed opposite to each other, and a bent portion 23 connected between the fixed portion 21 and the sliding portion 22. The fixed portion 21 is disposed on the frame 10.

The movable support mechanism 30 comprises a sliding assembly 31 and a stretching assembly 32 slidably connected to the frame 10. The sliding assembly 31 contacts and is connected to the bent portion 23. The stretching assembly 32 is connected to the sliding component 31 and is fixed connected to one end of the sliding portion 22 away from the bent portion 22, so that the sliding assembly 31 abuts against the bent portion 23.

Further, the sensor 40 is arranged on one side of the sliding portion 22 away from the fixed portion 21.

The stretching assembly 32 is configured to drive movement of the bent portion 23 and the sliding portion 22 during a sliding process relative to the frame 10, and to drive the sliding assembly 31 to slide relative to the frame 10, so that the bent portion 23 is in a first position to cover the sensor 40, or the bent portion 23 is in a second position to expose the sensor 40.

It should be noted that in the present application, one side of the fixed portion 21 away from the sliding portion 22 is a display surface, and one side of the bent portion 23 facing the display surface can be used for displaying images. Neither one side of the bent portion 23 away from the display surface nor the sliding portion 22 displays images.

In practice, the present application arranges the sensor 40 on one side of the flexible screen 20, and has the stretching assembly 32 slidably connected to the frame 10 and the sliding assembly 31 connected to the stretching assembly 32. The sliding assembly 31 abuts against the bent portion 23 of the flexible screen 20, and the stretching assembly 32 is connected to the sliding portion 22 of the flexible screen 20, so that in a sliding process relative to the frame 10, the stretching assembly 32 can drive sliding movement of the sliding assembly 31 to thereby drive movement of the bent portion 23 and the sliding portion 22, and as a result, the bent portion 23 is in the first position to cover the sensor 40, or the bent portion 23 is in the second position to expose the sensor 40. Accordingly, when the sensor 40 is not in use, full-screen display is enabled to improve display performance of the display device. When the sensor 40 is in use, the sensor 40 can be directly exposed to increase light transmittance and improve sensing performance of the sensor 40.

Specifically, as shown in FIG. 1, the display device comprises: a rear cover 73; the frame 10 arranged on one side of the rear cover 73; the flexible screen 20; the sensor 40; the sliding assembly 31 arranged on the frame 10; the stretching assembly 32; a driving module 71; and a cover plate 72 arranged on one side of the flexible screen 20 away from the rear cover 73.

Figure 2:
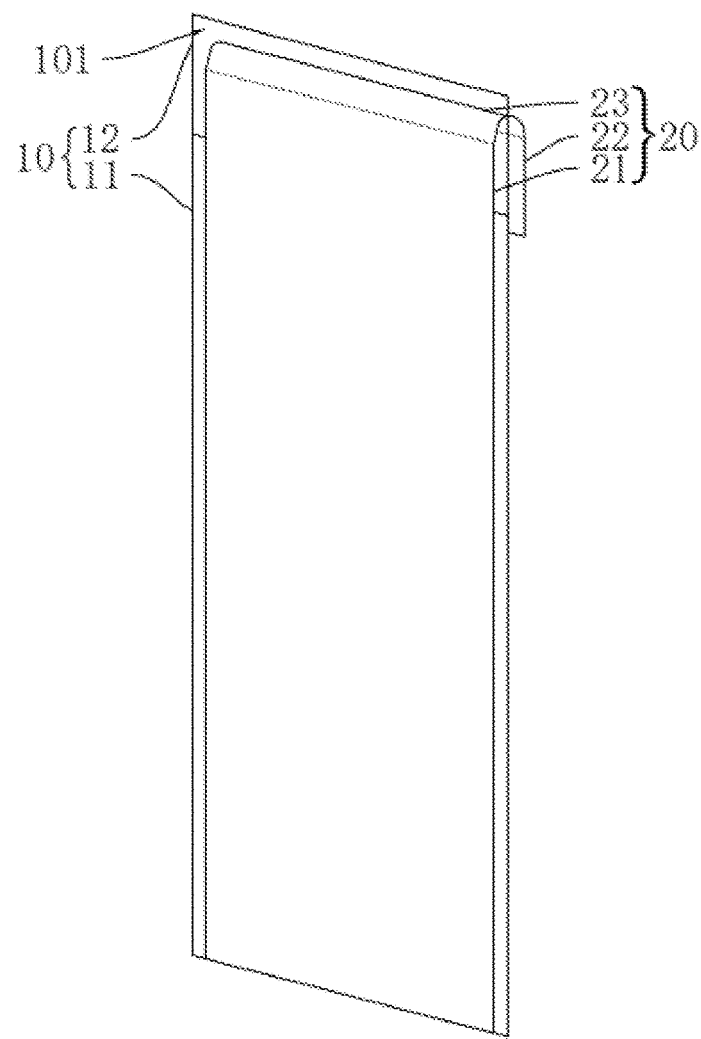
FIG. 2 is a schematic view illustrating a positional and structural relationship of a flexible screen and a frame according to one embodiment of the present application.

The flexible screen 20 comprises the fixed portion 21 fixedly connected to the frame 10, the sliding portion 22 that is slidable relative to the frame 10, and the bent portion 23 connected between the fixed portion 21 and the sliding portion 22. It should be noted that the frame 10 comprises an opening 101, the fixed portion 21 is disposed on one side of the frame 10 away from the rear cover 73, and the bent portion 23 is inserted through the opening 101 (as shown in FIG. 2), so that the sliding portion 22 is disposed on one side of the frame 10 away from the fixed portion 21. That is to say, the sliding portion 22 is disposed on one side of the frame 10 close to the rear cover 73.

Optionally, the frame 10 comprises a first frame 11 and a second frame 12 detachably connected to the first frame 11, and the opening 101 is defined in the second frame 12, so that during an assembly process of the display device, only the second frame 12 is disassembled or assembled to dispose the flexible screen 20 and other components on two sides of the frame 10, which facilitates assembling of the display device.

The sliding assembly 31 is slidably connected to the frame 10, and one end of the sliding assembly 31 is in contact with and connected to the bent portion 23 of the flexible screen Preferably, a reel 313 is disposed in a position where the sliding component 31 and the bent portion 23 are connected, and the bent portion 23 is in contact with and connected to the reel 313. The reel 313 is rotatable, and the reel 313 contacts the bent portion 23 by an arc surface, so when the bent portion 23 is moving, the bent portion 23 conformingly contacts the reel 313. Besides, rotation of the reel 313 also reduces a stress on the bent portion 23. Therefore, production yields of the flexible screen 20 can be improved.

Optionally, a first sliding block 311 is disposed on the frame 10, and a first sliding groove 312 slidably connected to the first sliding block 311 is defined on the sliding assembly 31, so that the sliding assembly 31 can slide relative to the frame 10.

The stretching assembly 32 is slidably connected to the frame 10. In addition, one end of the stretching assembly 32 is fixedly connected to the sliding portion 22 of the flexible screen 20, and another end of the stretching assembly 32 is connected to the sliding assembly 31.

Optionally, a second sliding block 321 is disposed on the frame 10, and a second sliding groove 322 slidably connected to the second sliding block 321 is defined on the stretching assembly 32, so that the stretching assembly 32 can slide with respect to the frame 10.

It should be noted that the sliding assembly 31 and the stretching assembly 32 are both arranged on one side of the frame 10 close to the rear cover 73. In a sliding process of the stretching assembly 32 sliding relative to the frame 10, the sliding portion 22 and the bent portion 23 are driven to move in a same direction, and the sliding assembly 31 is also driven to slide in the same direction relative to the frame 10. Alternatively, in a process of the sliding assembly 31 sliding relative to the frame 10, the stretching assembly 32 is driven to slide in a same direction, and at the same time, the sliding portion 22 and the bent portion 23 are also driven to move in the same direction. Accordingly, the bent portion 23 is in the first position is to shield the sensor 40, or the bent portion 23 is in the second position to expose the sensor 40. In addition, the movable support mechanism 30 also comprises a transmission member connected between the sliding assembly 31 and the stretching assembly 32. When one of the sliding assembly 31 and the stretching assembly 32 moves, the transmission member is used to drive the other one of the sliding assembly 31 and the stretching assembly 32 to move in a same direction.

Figure 3:
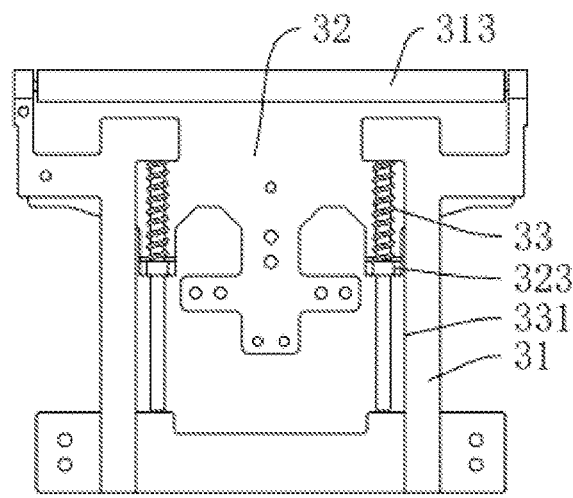
FIG. 3 is a schematic view illustrating a connection and structural relationship of a stretching assembly and a sliding assembly according to one embodiment of the present application.

In the present application, as shown in FIGS. 1 and 3, the transmission member comprises an elastic member 33. The movable support mechanism 30 also comprises a support rod 331 disposed on the sliding assembly 31, and the elastic member 33 is sleeved on the support rod 331.

One end of the support rod 331 is connected to the sliding assembly 31, and another end of the support rod 331 is inserted through an end portion 323 of the stretching assembly 32. An opening is defined in the end portion 323, so that the another end of the support rod 331 can pass through. In addition, one end of the elastic member 33 close to the reel 313 is connected to the sliding assembly 31, and one end of the elastic member 33 away from the reel 313 is connected to the end portion 323 of the stretching assembly 32. Because the bent portion 23 abuts on the reel 313, one end of the elastic member 33 close to the bent portion 23 is connected to the sliding assembly 31, and one end of the elastic member 33 away from the bent portion 23 is connected to the end portion 323 of the stretching assembly 32.

Whether the bent portion 23 is in the first position or the second position, the elastic member 33 is in a compressed state. Therefore, there is a pre-tension force between the sliding assembly 31 and the stretching assembly 32 at all times. Besides, the sliding assembly 31 abuts against the bent portion 23, and the stretching assembly 32 is fixedly connected to the sliding portion 22. As a result, there is the pre-tension force between the sliding assembly 22 and the bent portion 23 at all times, so that the flexible screen 20 is in a tensioned state, thus preventing the sliding assembly 22 and the bent portion 23 from undulating during movement, thereby improving display performance of the display device.

In the present application, the sensor 40 is disposed on one side of the sliding portion 22 away from the fixed portion 21. Specifically, the sensor 40 is disposed on one side of the flexible screen 20 away from the display surface and is disposed near the bent portion 23.

Optionally, the sensor 40 is an optical sensor, such as a fingerprint recognition sensor, an infrared sensor, a distance sensor, or a camera. The present application takes the camera as an example for description.

Figure 4:
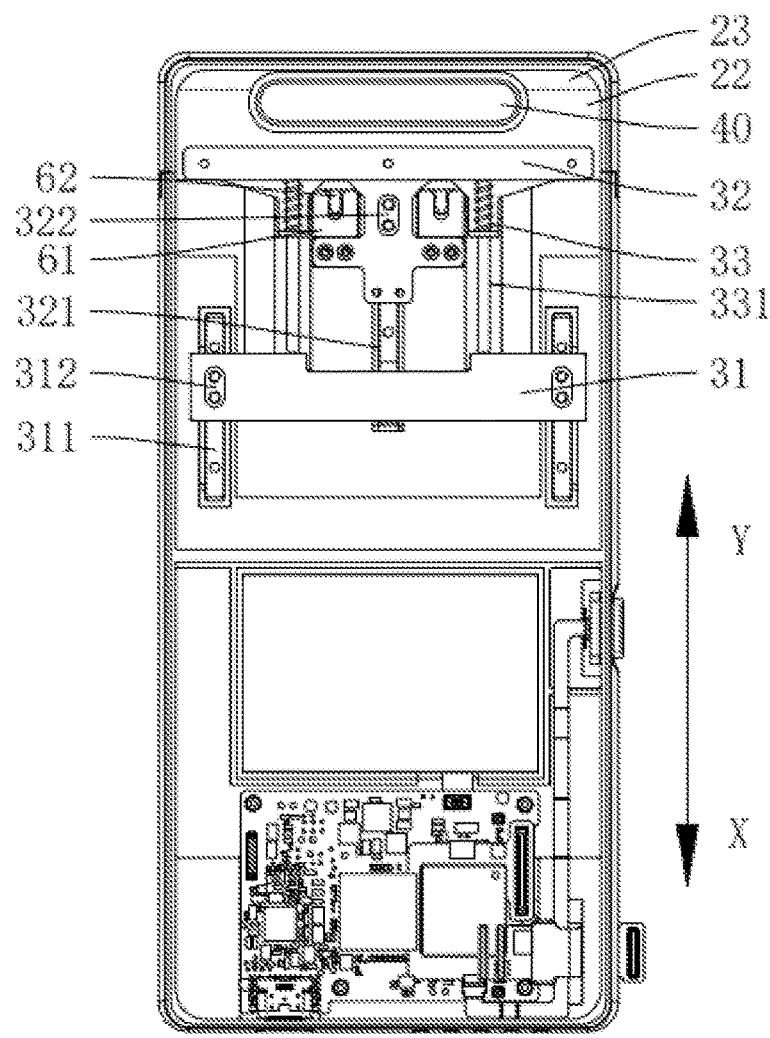
FIG. 4 is a rear view of the display device in a full-screen state according to one embodiment of the present application.
Figure 5:
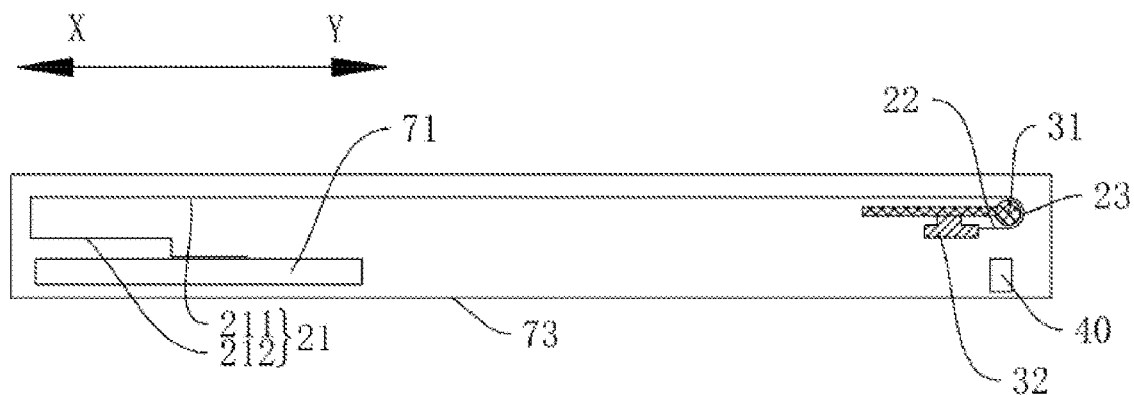
FIG. 5 is a cross-sectional view of the display device in the full-screen state according to one embodiment of the present application.
Figure 6:
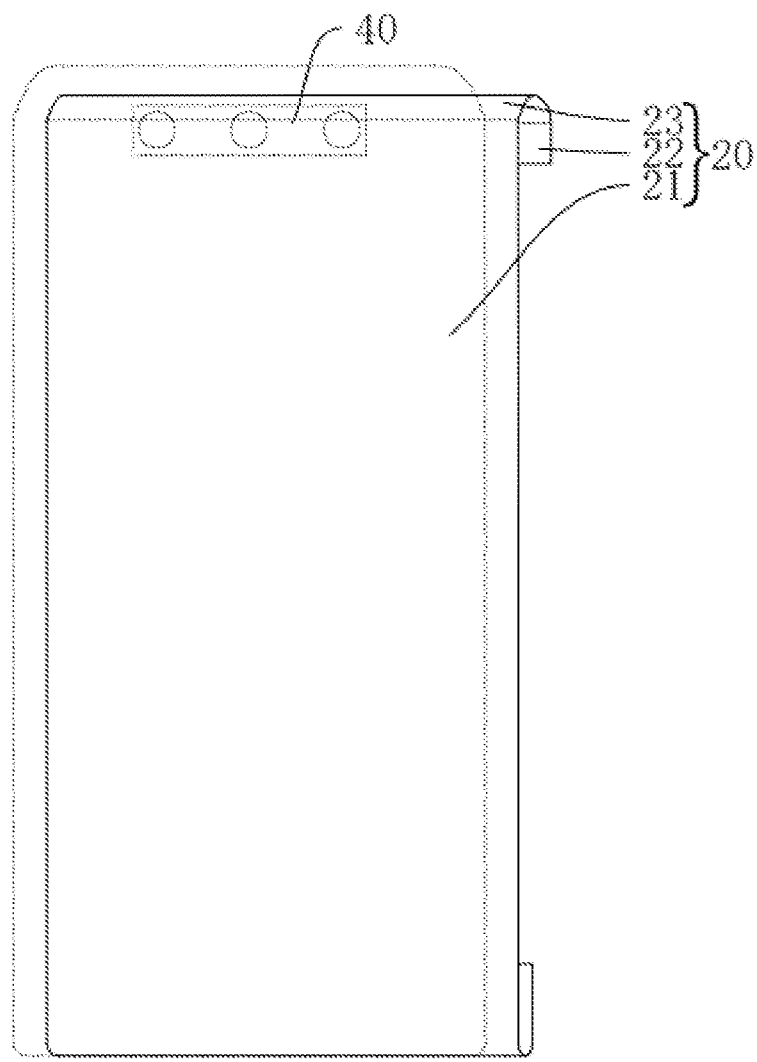
FIG. 6 is a front view of the display device in the full-screen state according to one embodiment of the present application.

Please refer to FIGS. 4, 5, and 6. The display device of the present application is in a full-screen state, that is, the bent portion 23 is in the first position to shield the sensor 40.

Figure 7:
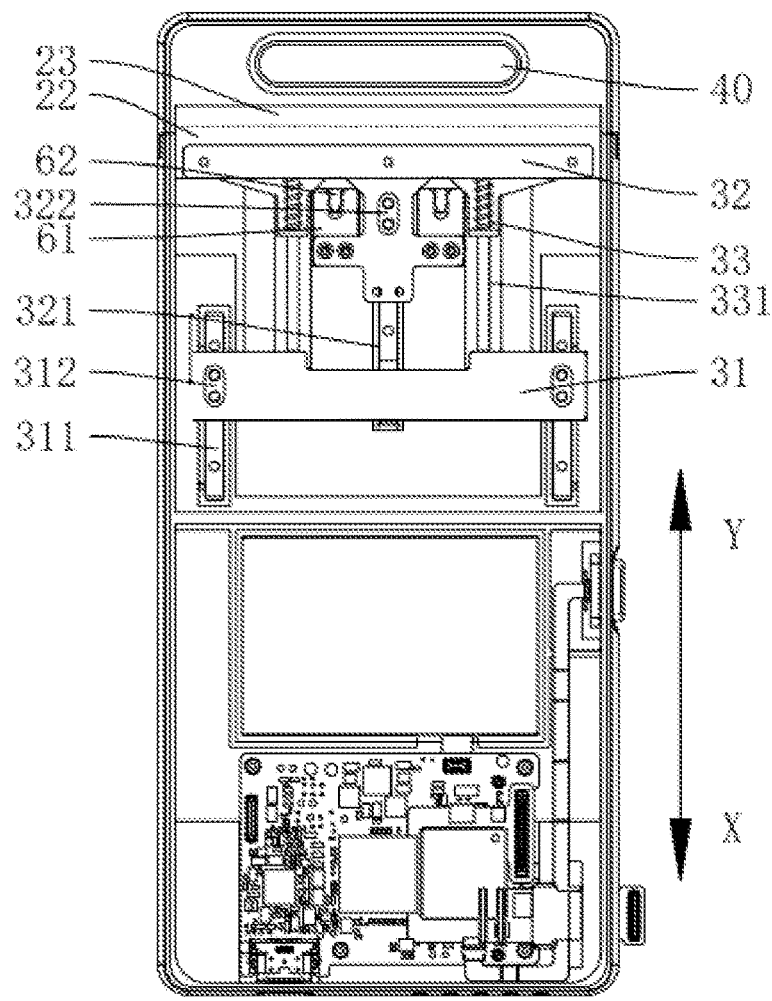
FIG. 7 is a rear view of the display device in a front shooting state according to one embodiment of the application.
Figure 8:
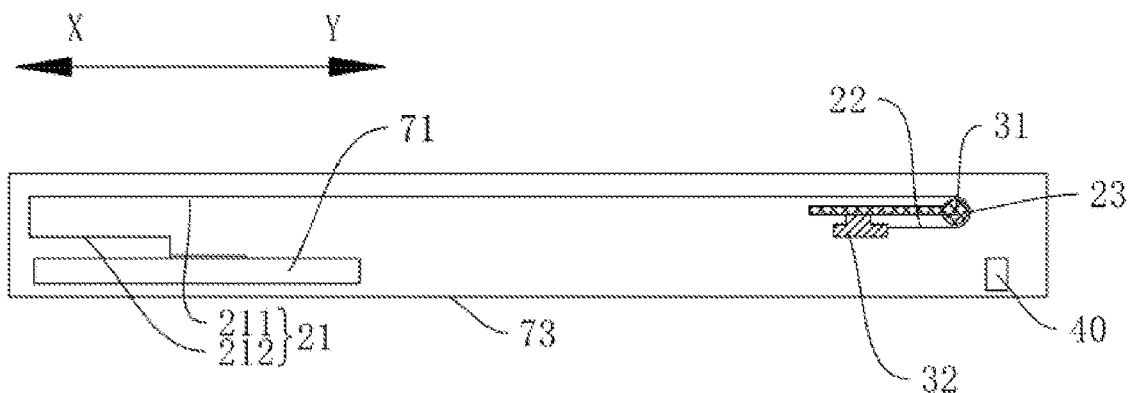
FIG. 8 is a cross-sectional view of the display device in the front shooting state according to one embodiment of the present application.
Figure 9:
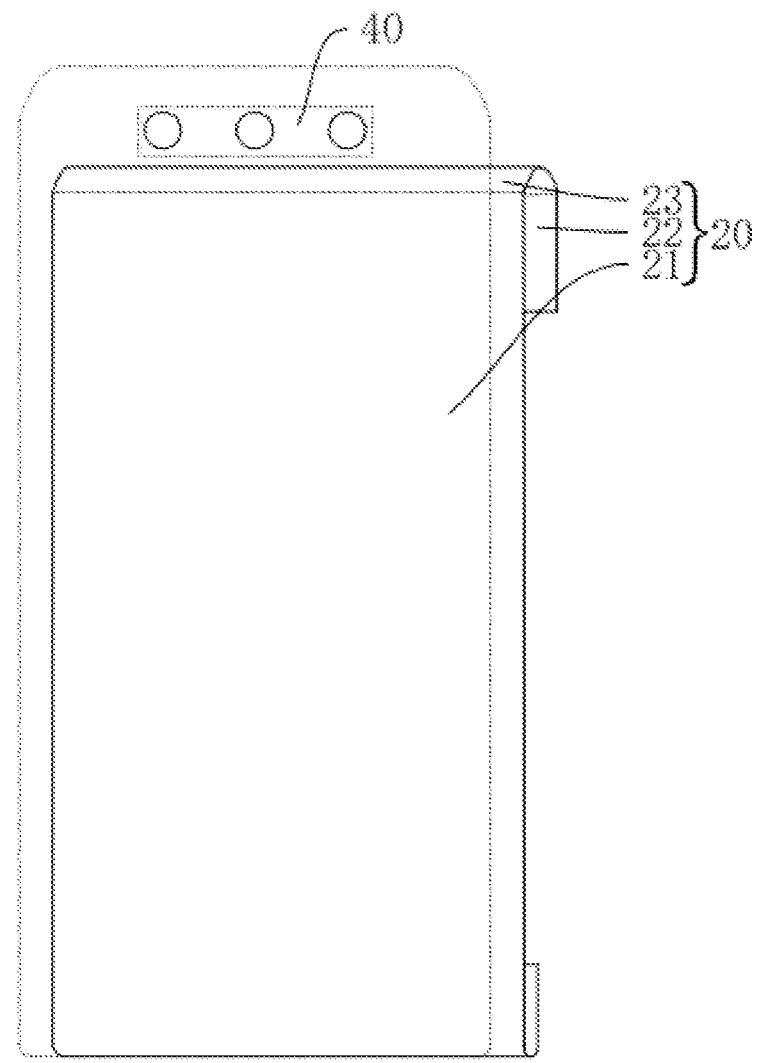
FIG. 9 is a front view of the display device in the front shooting state according to one embodiment of the present application.

Please refer to FIG. 7, FIG. 8, and FIG. 9. The display device of the present application is in a front shooting state, that is, the bent portion 23 is in the second position to expose the sensor 40.

Specifically, a detailed description of the display device of the present application is provided in conjunction with FIG. 1, FIG. 2, FIG. 3, FIG. 4, FIG. 5, FIG. 6, FIG. 7, FIG. 8, and FIG. 9, so as to illustrate a switching process between the full-screen state and the front shooting state.

First, a direction from the second frame 12 to the first frame 11 is set as the first direction X, and a direction from the first frame 11 to the second frame 12 is set as the second direction Y.

When the display device is switched from the full-screen state to the front shooting state, that is, when the bent portion 23 moves from the first position to the second position, the stretching assembly 32 is driven to slide relative to the frame 10 along the first direction X. Since the stretching assembly 32 is fixedly connected to the sliding portion 22 of the flexible screen 20, the stretching assembly 32 can drive the sliding portion 22 to move in the first direction X, and movement of the sliding portion 22 drives the bent portion 23 to move along the first direction X. Since the bent portion 23 is in contact with the sliding assembly 31, and because the sliding assembly 31 is slidably connected to the frame 10, the bent portion 23 can drive the sliding assembly 31 to slide along the first direction X relative to the frame 10 when the bent portion 23 moves in the first direction X. Accordingly, the stretching assembly 32, the sliding portion 22, the bent portion 23, and the sliding assembly 31 all move in the first direction X, so that the bent portion 23 moves from the first position to the second position to expose the sensor 40.

It should be noted that the stretching assembly 32 and the sliding assembly 31 are connected by the elastic member 33, and the elastic member 33 is always in the compressed state. Therefore, in a process of the stretching assembly 32 and the sliding assembly 31 both sliding relative to the frame 10, the stretching assembly 32 receives from the elastic member 33 a force in the first direction X, and the sliding assembly 31 receives from the elastic member 33 a force in the second direction Y. Furthermore, the stretching assembly 32 is connected to the sliding portion 22, and the sliding assembly 31 abuts against the bent portion 23, so that the sliding portion 22 and the bent portion 23 can be in a tensioned state at all times, thus preventing the sliding portion 22 and the bent portion 23 from undulating during movement. Accordingly, the display performance of the display device can be improved.

When the display device is switched from the front shooting state to the full-screen state, that is, when the bent portion 23 moves from the second position to the first position, the stretching assembly 32 can be driven to slide relative to the frame 10 in the second direction Y. Since the stretching assembly 32 is fixedly connected to the sliding portion 22 of the flexible screen 20, the stretching assembly 32 can drive the sliding portion 22 to slide in the second direction Y.

Furthermore, since the elastic member 33 connected between the stretching assembly 32 and the sliding assembly 31 is always in the compressed state, that is, the sliding assembly 31 receives from the elastic member 33 a force in the second direction Y. Therefore, when the stretching assembly 32 slides in the second direction Y, the sliding assembly 31 is driven by the force of the elastic member 33 in the second direction Y to slide relative to the frame 10 in the second direction Y. The bent portion 23 abuts against the sliding assembly 31, so the bent portion 23 receives a force of the sliding assembly 31 in the second direction Y to drive the bent portion 23 to move in the second direction Y, that is, to drive the bent portion 23 to move from the second position to the first position to cover the sensor 40.

Similarly, during the process of the stretching assembly 32 and the sliding assembly 31 sliding relative to the frame 10, the stretching assembly 32 receives from the elastic member 33 the force in the first direction X, and the sliding assembly 31 receives from the elastic member 33 the force in the second direction Y. Besides, the stretching assembly 32 is connected to the sliding portion 22, and the sliding assembly 31 abuts against the bent portion 23, so that the sliding portion 22 and the bent portion 23 are always in the tensioned state, thus preventing the sliding portion 22 and the bent portion 23 from undulating during movement, thereby improving the display performance of the display device.

A position of the bent portion 23 in FIG. 5 is the first position, and a position of the bent portion 23 in FIG. 8 is the second position.

It should be noted that in other embodiments of the present application, the sliding assembly 31 can also be actively driven to slide relative to the frame 10 in the first direction X, so as to drive movement of the bent portion 23, the stretching assembly 32, and the sliding portion 22, so that the display device is switched from the full-screen state to the front shooting state. The sliding assembly 31 is actively driven to slide relative to the frame 10 in the second direction Y, so as to drive movement of the bent portion 23, the stretching assembly 32, and the sliding portion 22, so that the display device is switched from the front shooting state to the full-screen state. Choices can be made according to actual needs, and the present application is not limited in this regard.

In summary, the present application arranges the sensor 40 on one side of the flexible screen 20, and has a stretching assembly 32 slidably connected to the frame 10 and a sliding assembly 31 connected to the stretching assembly 32. The sliding assembly 31 abuts against the bent portion 23 of the flexible screen 20, the stretching assembly 32 is connected to the sliding portion 22 of the flexible screen 20, and then the stretching assembly 32 can drive the sliding assembly 31 to move during the process of the stretching assembly 32 sliding relative to the frame 10, thereby driving movement of the bent portion 23 and the sliding portion 22, so that the bent portion 23 is in the first position to cover the sensor 40, or in the second position to expose the sensor 40. Accordingly, when the sensor 40 is not in use, the full-screen display is enabled to improve the display performance of the display device, and when the sensor 40 is in use, the sensor 40 can be directly exposed to increase the light transmittance and improve the sensing capability of the sensor 40. In addition, in the present application, the elastic member 33 is disposed between the stretching assembly 32 and the sliding assembly 31, and the elastic member 33 is always in the compressed state, so that the stretching assembly 32 receives from the elastic member 33 the force in the first direction X, and the sliding assembly 31 receives from the elastic member 33 the force in the second direction Y. As a result, the sliding portion 22 and the bent portion 23 are in the tensioned state at all times, and do not undulate during the movement, so as to further improve the display performance of the display device.

Furthermore, in the present application, the display device further comprises a first lock member 61 arranged on the movable support mechanism 30 and a second lock member 62 arranged on the frame 10. When the bent portion 23 is in the first position, the first lock member 61 and the second lock member 62 are detachably connected to each other. When the bent portion 23 is in the second position, the first lock member 61 is separated from the second lock member 62.

Specifically, the first lock member 61 is disposed on the stretching assembly 32, and the second lock member 62 is disposed on the frame 10. The first lock member 61 can be a fixed base, and the second lock member 62 can be an elastic piece, such that the first lock member 61 and the second lock member 62 form an elastic-piece-type engagement connection structure. In addition, the display device can further comprise a third lock member and a fourth lock member, the third lock member can be disposed on the sliding assembly 31, and the fourth lock member can be disposed on the frame 10. When the bent portion 23 is in the first position, the third lock member and the fourth lock member are detachably connected to each other. When the bent portion 23 is in the second position, the third lock member is separated from the fourth lock member. The third lock member and the fourth lock member can also adopt a spring-piece-type engagement connection structure. In the present application, multiple lock members are disposed between the movable support mechanism 30 and the frame 10, thereby improving stability of the movable support mechanism 30 when the display device is in the full-screen state and the front shooting state.

The display device further comprises a driving member 50 to drive the movable support mechanism 30 to slide.

Optionally, the driving member 50 is connected to the stretching assembly 32 to drive the stretching assembly 32 to slide relative to the frame 10, so as to make the bent portion 23 to move between the first position and the second position.

One end of the driving member 50 is connected to the stretching assembly 32, and the other end of the driving member 50 is inserted through the opening defined in the rear cover 73 and is exposed from the surface of the rear cover 73. Users can slide the driving member 50 to drive the stretching assembly 32 to slide.

It should be noted that the above process adopts a manual driving method. In other embodiments of the present application, the driving member 50 can also be a motor, and an output end of the motor is connected to the stretching assembly 32 to drive the stretching assembly 32 to slide relative to the frame 10.

In addition, in other embodiments of the present application, the driving member 50 can also be connected to the sliding assembly 31 to drive the sliding assembly 31 to slide relative to the frame 10, so that the display device can be switched between the full-screen state and the front shooting state.

In the present application, the display device further comprises a driving module 71, and the driving module 71 is disposed on one side of the flexible screen 20 close to the rear cover 73. Referring to FIG. 5 and FIG. 8, the fixed portion 21 of the flexible screen 21 comprises a display sub-portion 211 and a bonding sub-portion 212. The bonding sub-portion 212 is disposed on one side of the fixed portion 21 away from the bent portion 23, and the display sub-portion 211 is connected between the bonding sub-portion 212 and the bent portion 23.

The bonding sub-portion 212 is bent to one side of the flexible screen 20 facing the rear cover 73, and is bonded and connected to the driving module 71 to realize transmission of electric signals.

In the present application, the display sub-portion 211 and the bonding sub-portion 212 are both fixed on the frame 10, and only the bent portion 23 and the sliding portion 22 can move to cover the sensor 40 or expose the sensor 40.

It should be noted that in the display device of the present application, black ink can be arranged around the sensor 40. For example, the black ink can be applied to an area surrounding the sensor 40 and located on the rear cover. Therefore, when the bent portion 23 moves to the second position and the sensor 40 is exposed, the black ink serves flaws concealment purposes to improve the display performance. In addition, the present application is not limited to the black ink, and other methods can be used to provide flaws concealment configurations according to actual needs.

Furthermore, the flexible screen 20 comprises a panel body, and a backplate support layer disposed on one side of the panel body facing the rear cover 73. In the present application, the stretching assembly 32 is fixedly connected to the backplate support layer in a position corresponding sliding portion 22, and the sliding assembly 31 abuts against the backplate support layer in a position corresponding to the bent portion 23. Since the backplate support layer has better toughness, it can bear more force than other structures of the flexible screen 20. Therefore, by connecting the stretching assembly 32 and the sliding assembly 31 to the backplate support layer, the present application can prevent the panel body and other structures of the flexible screen 20 from being damaged due to stress, thereby ensuring production yields of the display device.

Furthermore, the backplate support layer is also provided with a patterned structure in a position corresponding to the bent portion 23, which can effectively alleviate a bending stress received by the bent portion 23 of the flexible screen 20 during a bending process, thus improving a service life of the display device.

Optionally, the patterned structure of the backplate support layer comprises a plurality of openings, and the openings are arranged in rows and columns, and the openings in two adjacent rows are staggered.

Further, the present application also provides a mobile terminal. The mobile terminal comprises the display device and the terminal body described in the foregoing embodiments, and the display device and the terminal body are combined into one body.

In the above-mentioned embodiments, the description of each embodiment has its own emphasis. For those that are not described in detail in one embodiment, reference may be made to related descriptions of other embodiments.

The above is a detailed description about a display device and a mobile terminal of the present application. Specific examples are used in the present disclosure to illustrate the working principles and embodiments of the present application. The description of the above embodiments is only used for ease of understanding technical solutions and main ideas of the present application. Those of ordinary skill in the art can still modify the technical solutions or equivalently replace some of the technical features in the foregoing embodiments. Such modifications or replacements should be deemed to be within the protection scope of the technical solutions of the embodiments of the present application.

What is claimed is:

1. A display device, comprising: a frame; a flexible screen comprising a fixed portion and a sliding portion which are arranged opposite to each other, wherein a bent portion is connected between the fixed portion and the sliding portion, and the fixed portion is disposed on the frame; a movable support mechanism comprising a sliding assembly and a stretching assembly slidably connected to the frame, wherein the sliding assembly contacts and is connected to the bent portion, and the stretching assembly is connected to the sliding assembly and is fixedly connected to one end of the sliding assembly away from the bent portion, so that the sliding assembly abuts against the bent portion; and a sensor arranged on one side of the sliding portion away from the fixed portion; wherein the stretching assembly is configured to drive movement of the sliding portion and the bent portion during a sliding process relative to the frame, and to drive the sliding assembly to slide relative to the frame, so that the bent portion is in a first position to shield the sensor when the sensor is not in use, or the bent portion is in a second position to expose the sensor when the sensor is in use; and an opening is defined on one side of the frame close to the bent portion, the fixed portion is disposed on one side of the frame, and the bent portion is inserted through the opening, so that the sliding portion is disposed on one side of the frame away from the fixed portion; and one end of an elastic member close to the bent portion is connected to the sliding assembly, and one end of the elastic member away from the bent portion is connected to the stretching assembly; whether the bent portion is in the first position or the second position, the elastic member is in always a compressed state.

2. The display device according to claim 1, wherein a reel is disposed at one end of the sliding assembly connected to the bent portion, and the bent portion abuts on the reel.

3. The display device according to claim 1, wherein the frame comprises a first frame and a second frame detachably connected to one end of the first frame close to the bent portion, and the opening is defined in the second frame.

4. The display device according to claim 1, wherein the display device further comprises a driving member connected to the stretching assembly to drive the stretching assembly to move and to drive the bent portion to move between the first position and the second position.

5. The display device according to claim 1, wherein the display device further comprises a first lock member arranged on the movable support mechanism and a second lock member arranged on the frame; the first lock member and the second lock member are detachably connected to each other when the bent portion is in the first position; and the first lock member and the second lock member are separated from each other when the bent portion is in the second position.

6. A mobile terminal, comprising a display device and a terminal body combined into one body, wherein the display device comprises: a frame; a flexible screen comprising a fixed portion and a sliding portion which are arranged opposite to each other, wherein a bent portion is connected between the fixed portion and the sliding portion, and the fixed portion is disposed on the frame; a movable support mechanism comprising a sliding assembly and a stretching assembly slidably connected to the frame, wherein the sliding assembly contacts and is connected to the bent portion, and the stretching assembly is connected to the sliding assembly and is fixedly connected to one end of the sliding assembly away from the bent portion, so that the sliding assembly abuts against the bent portion; and a sensor arranged on one side of the sliding portion away from the fixed portion; wherein the stretching assembly is configured to drive movement of the sliding portion and the bent portion during a sliding process relative to the frame, and to drive the sliding assembly to slide relative to the frame, so that the bent portion is in a first position to shield the sensor when the sensor is not in use or the bent portion is in a second position to expose the sensor when the sensor is in use; and an opening is defined on one side of the frame close to the bent portion, the fixed portion is disposed on one side of the frame, and the bent portion is inserted through the opening, so that the sliding portion is disposed on one side of the frame away from the fixed portion; and one end of an elastic member close to the bent portion is connected to the sliding assembly, and one end of the elastic member away from the bent portion is connected to the stretching assembly; whether the bent portion is in the first position or the second position, the elastic member is in always a compressed state.

7. The mobile terminal according to claim 6, wherein a reel is disposed at one end of the sliding assembly connected to the bent portion, and the bent portion abuts on the reel.

8. The mobile terminal according to claim 6, wherein the frame comprises a first frame and a second frame detachably connected to one end of the first frame close to the bent portion, and the opening is defined in the second frame.

9. The mobile terminal according to claim 6, wherein the display device further comprises a driving member connected to the stretching assembly to drive the stretching assembly to move and to drive the bent portion to move between the first position and the second position.

10. The mobile terminal according to claim 6, wherein the display device further comprises a first lock member arranged on the movable support mechanism and a second lock member arranged on the frame; the first lock member and the second lock member are detachably connected to each other when the bent portion is in the first position; and the first lock member and the second lock member are separated from each other when the bent portion is in the second position.

* * * * *